(12) United States Patent
Heim et al.

(10) Patent No.: US 7,472,469 B2
(45) Date of Patent: Jan. 6, 2009

(54) METHOD FOR FABRICATING A MAGNETIC HEAD HAVING A SENSOR STACK AND TWO LATERAL STACK

(75) Inventors: David Eugene Heim, Redwood City, CA (US); Kim Y. Lee, Fremont, CA (US); Tsann Lin, Saratoga, CA (US); Jih-Shiuan Luo, San Jose, CA (US); Chun-Ming Wang, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 492 days.

(21) Appl. No.: 11/231,438

(22) Filed: Sep. 20, 2005

(65) Prior Publication Data

US 2007/0064353 A1    Mar. 22, 2007

(51) Int. Cl.
*G11B 5/127* (2006.01)
*H04R 31/00* (2006.01)

(52) U.S. Cl. ............. 29/603.16; 29/603.11; 29/603.13; 29/603.14; 29/603.15; 29/603.18; 216/22; 216/65; 216/66; 360/324.1; 360/324.2; 360/324.11; 360/324.12; 451/5; 451/41

(58) Field of Classification Search .............. 29/603.11, 29/603.13–603.16, 603.18; 360/324.1, 324.2, 360/324.11, 324.12; 427/127–131; 216/22
See application file for complete search history.

(56) References Cited

U.S. PATENT DOCUMENTS

| | | | |
|---|---|---|---|
| 6,033,491 A * | 3/2000 | Lin | 148/108 |
| 6,074,767 A | 6/2000 | Lin | |
| 6,090,480 A | 7/2000 | Hayashi | |
| 6,466,418 B1 | 10/2002 | Horng et al. | |
| 6,614,630 B2 | 9/2003 | Horng et al. | |
| 6,778,364 B2 | 8/2004 | Dobisz et al. | |
| 7,344,330 B2 * | 3/2008 | Heim et al. | 403/315 |

* cited by examiner

*Primary Examiner*—Paul D Kim
(74) *Attorney, Agent, or Firm*—Patent Law Office of Larry Guernsey; Larry B. Guernsey (57) ABSTRACT

A method is disclosed for fabricating a read sensor for a magnetic head for a hard disk drive having a read sensor stack and two lateral stacks. The method of fabrication includes forming lateral stacks on a gap layer, surrounding a groove to form a template. The read sensor stack is then formed in the groove, which defines the lateral dimensions of the read sensor stack, and lead layers are then formed on the lateral stacks. Also disclosed is a read head for a disk drive having a sensor stack defined by pre-established lateral stacks, and a disk drive having the read head.

13 Claims, 8 Drawing Sheets

METHOD FOR FABRICATING A MAGNETIC HEAD HAVING A SENSOR STACK AND TWO LATERAL STACK

BACKGROUND OF THE INVENTION

1. Field of the Invention

The present invention relates generally to the fabrication of magnetic heads for disk drives and particularly to the manufacture of magnetic read heads.

2. Description of the Prior Art

In recent years there has been a constant effort to increase the performance of hard disk drives by increasing the a real data storage density of the magnetic hard disk. This is done by reducing the written data track width, such that more tracks per inch can be written on the disk. Read sensors, of which one type is referred to as a Giant Magneto-Resistive (GMR) head, have been developed to read trackwidths smaller than 130 nm. The manufacture of these read sensors depends upon the ability to ion mill the sensor to these very small dimensions, and to reliably lift-off the deposited layer materials.

Figure 4:
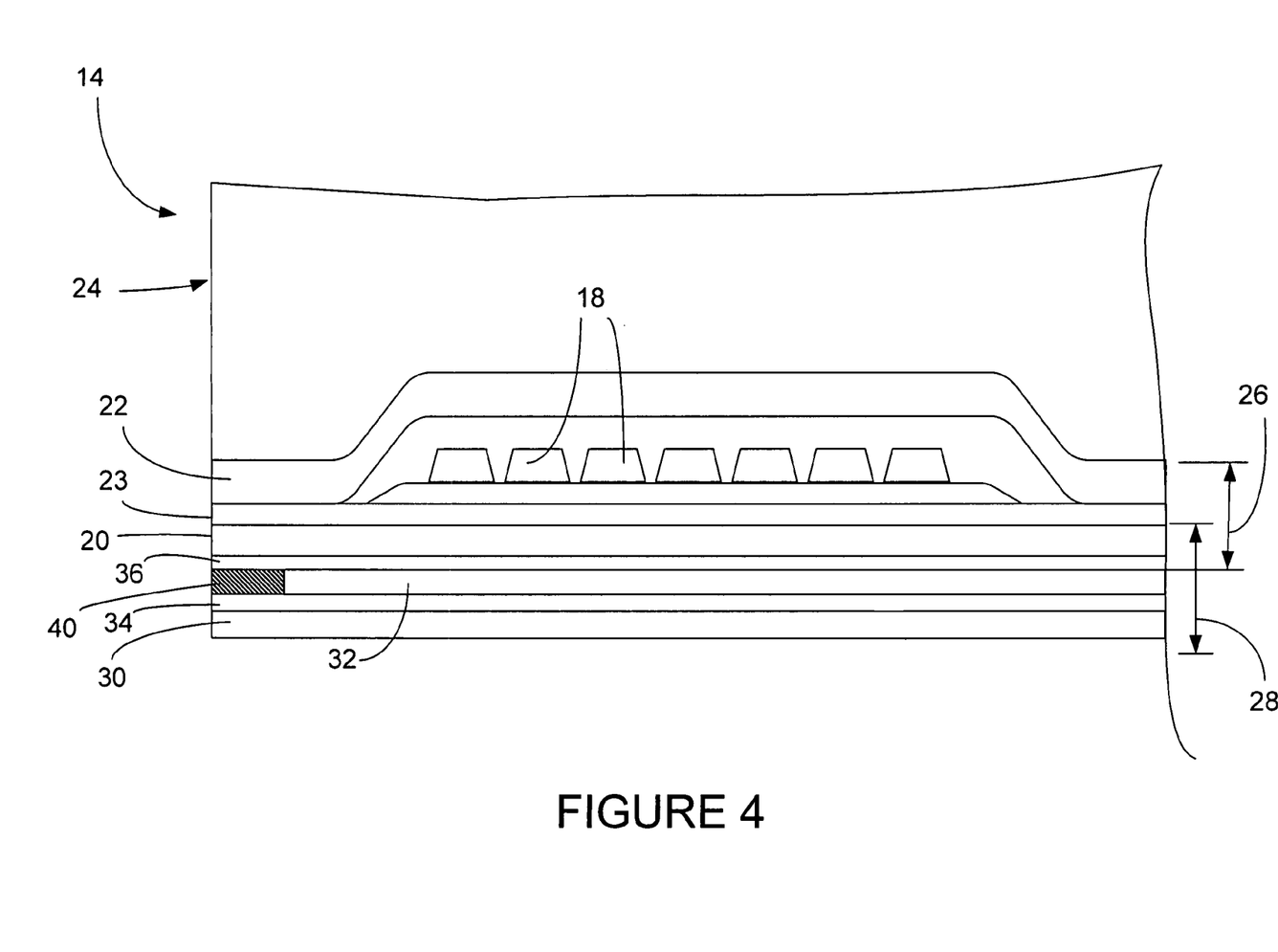
FIG. 4 is a cross-section view of an exemplary read/write head.

There are two configurations of read heads in common use in the industry today. These are called Current Perpendicular to the Plane (CPP), and Current In the Plane (CIP). In the CIP configuration, current flows from side to side; that is from a lead through the read sensor to another lead. A cross section view of a CIP slider is shown in FIG. 4, which generally includes a write head portion 26 and a read head portion 28. For CIP read heads, the read sensor 40 is generally sandwiched between two insulation layers, usually designated gap 1 34 and gap 2 36 which are made of non-conductive material, to keep the circuit from shorting out. These are further sandwiched by magnetic shield layers S1 30 and S2 20. For the purposes of this discussion, the read head 28 will be considered to be in CIP configuration.

Figure 5:
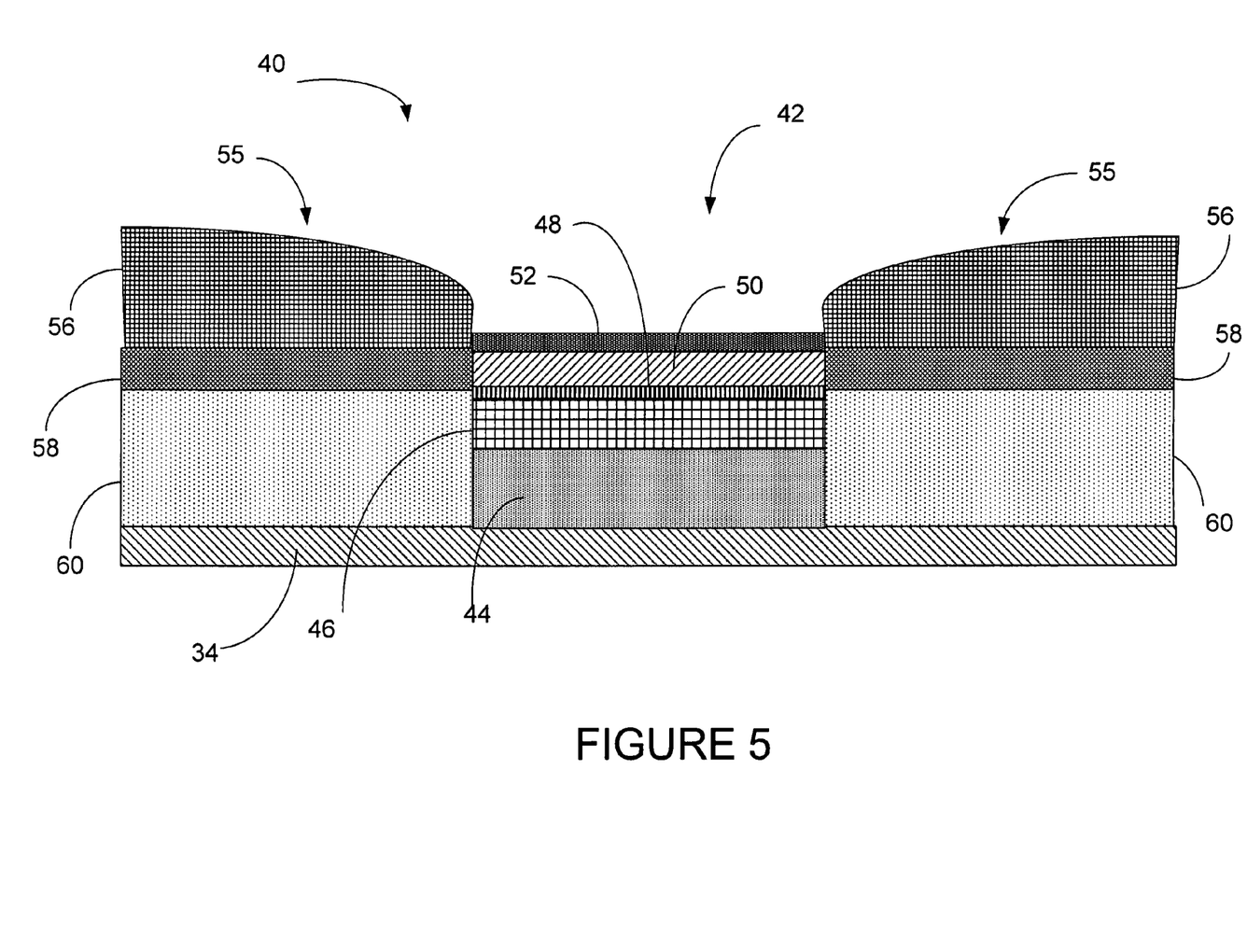
FIG. 5 is a front plan view of the structure of a CIP read sensor as seen from the ABS.

A typical CIP read sensor 40, and lead layer stacks 55, including lead layers 56, hard bias layers 58 and seed layers 60, are shown in FIG. 5. The sensor 40 is generally made up of a number of layers, to make a sensor stack 42, which generally includes an Anti-ferromagnetic (AFM) layer 44, a pinned magnetic layer 46, a spacer layer 48, a free magnetic layer 50 and a cap layer 52. The sensor stack 42 is built on the gap 1 insulating layer 34, as discussed above.

The lead layer stacks 55 are typically made up of lead layers 56 built on hard bias layers 58, built in turn on a seed layer 60. The hard bias layers 58 are generally aligned with the free layer 50 of the sensor stack 42, and act to give a bias direction to the magnetic domains in the free layer 50.

Figure 7:
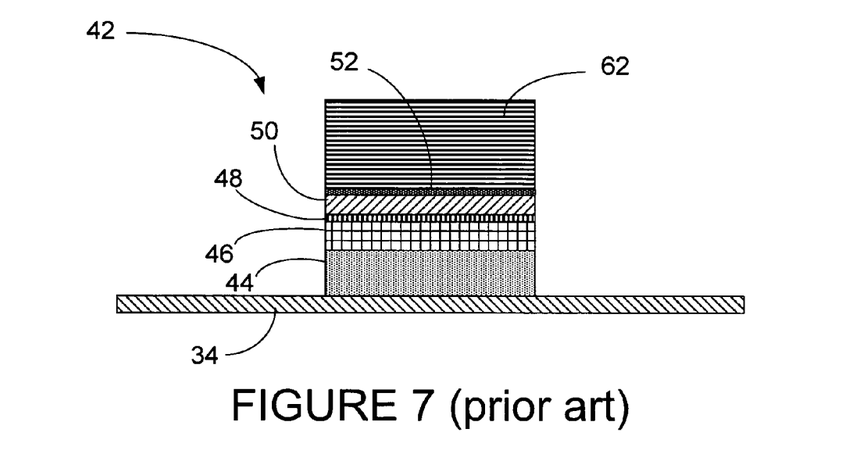
Figure 8:
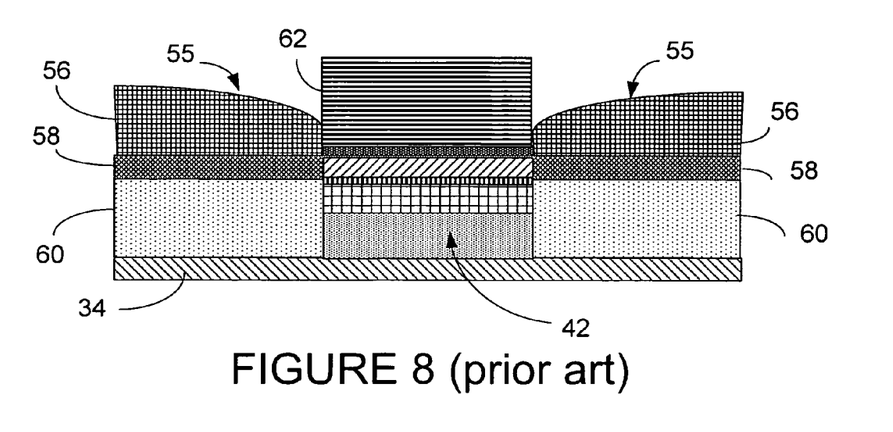

This configuration of sensor is referred to as a Giant Magneto-Resistive (GMR) read sensor, and typically the sensor stack 42 is formed first, and the lead layer stacks 54 are formed around them. The general methodology used in the prior art for forming the read head and leads is shown in FIGS. 6-8 (Prior art).

Figure 6:
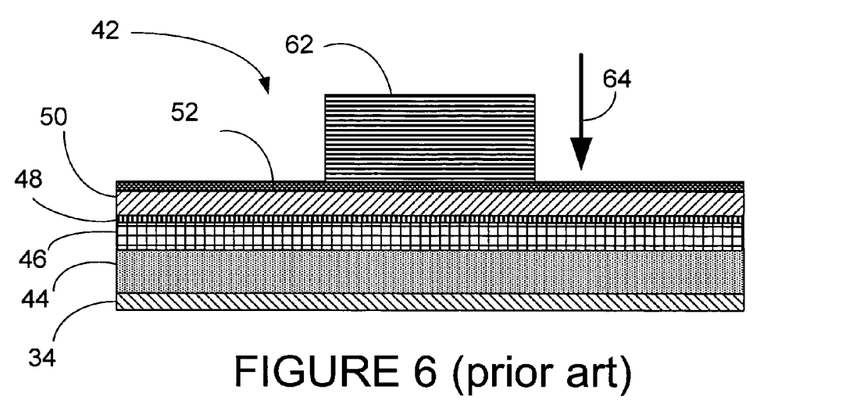
FIGS. 6-8 are front plan views of the stages in the fabrication of a CIP read sensor of the prior art as seen from the ABS.

FIG. 6 (prior art) shows that the sensor stack 42 including AFM layer 44, pinned layer 46, spacer layer 48, free layer 50 and cap layer 52 is built on gap1 34. A photomask 62 is then formed on the sensor stack 42 and an ion milling beam 64 is then used to shape the sensor stack 42 to that shown in FIG. 7 (prior art).

The lead layer stacks 55, which generally include seed layers 60, hard bias layers 58, and lead layers 56, are then formed around the sensor stack 42, before the photomask 62 is removed to complete this stage of the process.

This manufacturing process involves ion milling of the sensor stack 42. This milling step also partially mills the underlying gap1 layer 34. A potential disadvantage to the prior art process is the effect of ion milling on the GMR sensor 40 and gap1 34, and the growing demands on the associated lithography and liftoff process. Bombardment of energetic ions on a GMR sensor during milling may create damage such that its magnetic performance is undermined. This damage starts at the edges of a read track and propagates inwards. Thus the consequences will likely become more severe as the physical width of the read-head is reduced.

It is also known that uncontrolled milling of a gap layer can create catastrophic Electrostatic Discharge (ESD) problems. Again this may be attributable to physical damage to the gap material by ion bombardment.

Finally, the prior art process is preceded by increasingly complex photolithography and liftoff operations in order to accommodate shrinking dimensions. The milling process requires a masking material that has sufficient selectivity in order to retain adequate thickness for subsequent liftoff. With shrinking size, the required stack thickness may not be sustainable. Thus alternative methods may be required.

Thus there is a need for a method of fabrication for read sensors which does not involve subjecting the sensor stack materials to damage from ion milling, does not subject the gap1 layer to ESD damage and does not involve complicated photolithography and liftoff operations.

SUMMARY OF THE INVENTION

An embodiment of the present invention is a method for fabricating a read head for a magnetic head of a hard disk drive having a read sensor stack and two lateral stacks. The method of fabrication includes initially forming lateral stacks on a gap layer, surrounding a groove to form a template. The read sensor stack is then formed in the groove, which defines the lateral dimensions of the read sensor stack, and lead layers are formed on the lateral stacks.

Also disclosed is a read head for a disk drive, and a disk drive having the read head.

It is an advantage of the present invention that it presents a method for fabrication of read sensors which do not involve subjecting the sensor stack materials to damage from ion milling It is another advantage of the present invention that it presents a method for fabrication of read sensors which do not involve subjecting the gap layer to ion milling, thus avoiding ESD damage.

It is yet another advantage of the present invention that it presents a method for fabrication of read sensors which uses less complicated photolithography and liftoff operations.

It is still another advantage of the present invention that it presents a method for fabrication of read sensors which is less complex and provides for more efficient processing and fabrication of read sensors.

It is also an advantage of the present invention that it presents a method for fabrication of read sensors which is expected to provide greater production yields due to reduced damage from ion bombardment and thus less expense.

It is a further advantage of the present invention that the lateral stack layers act as a template for deposition of the GMR sensor, so that the read head is defined as deposited, rather than as milled.

It is still another advantage of the present invention that the thinness of the hard bias layer and the absence of ion-milling allows utilization of either a thin single imaging resist layer or a thin bilayer resist system (i.e. simplification of K5 lithography). This in turn allows higher resolution patterning, and facilitation of a standard liftoff process.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

The present invention is a read sensor defined by lateral stack templates, and a method for producing a magnetic head having this read sensor.

Figure 1:
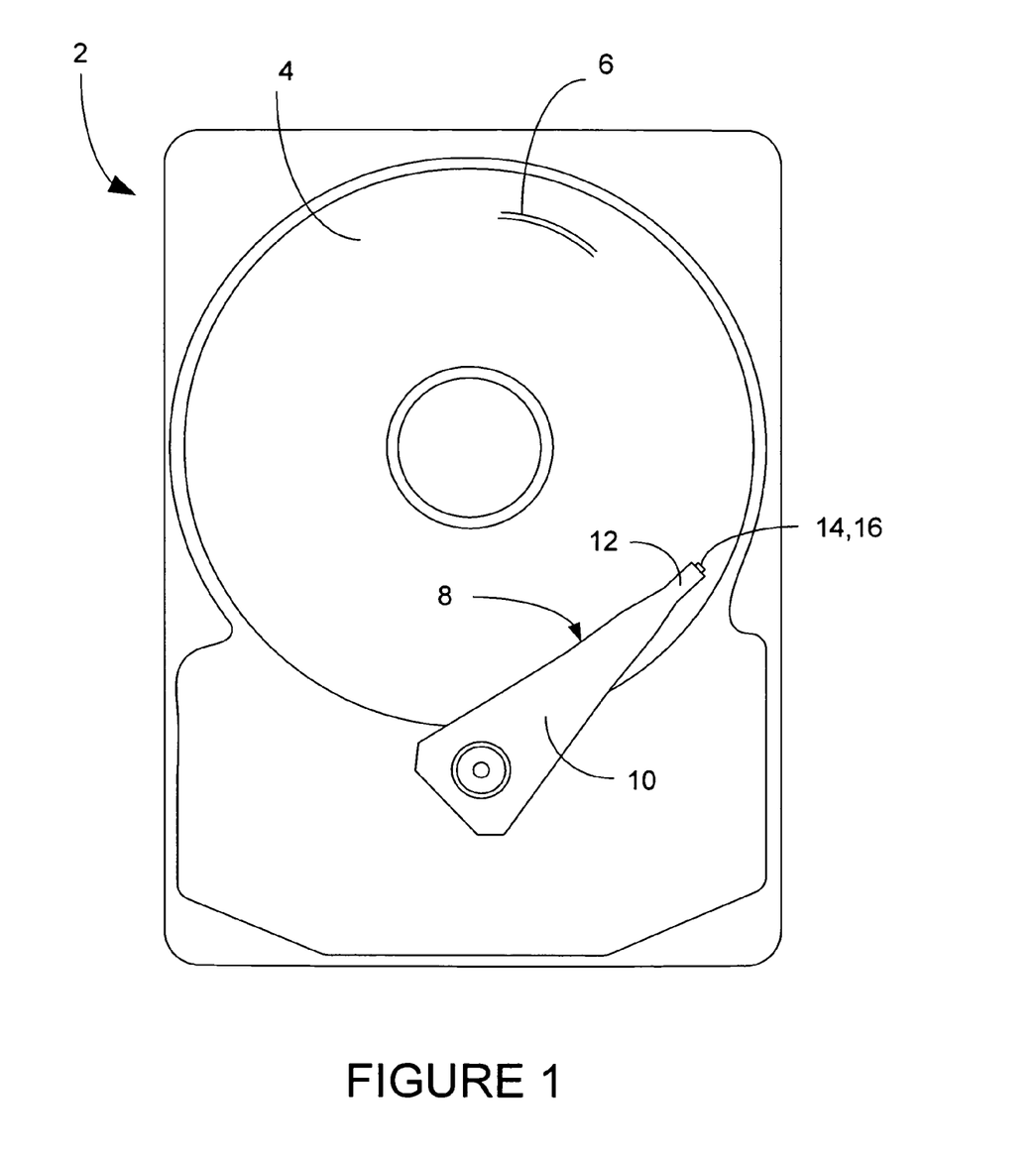
FIG. 1 shows a top plan view of an exemplary disk drive.

A hard disk drive 2 is shown generally in FIG. 1, having one or more magnetic data storage disks 4, with data tracks 6 which are written and read by a data read/write device 8. The data read/write device 8 includes an actuator arm 10, and a suspension 12 which supports one or more magnetic heads 14 included in one or more sliders 16.

Figure 2:
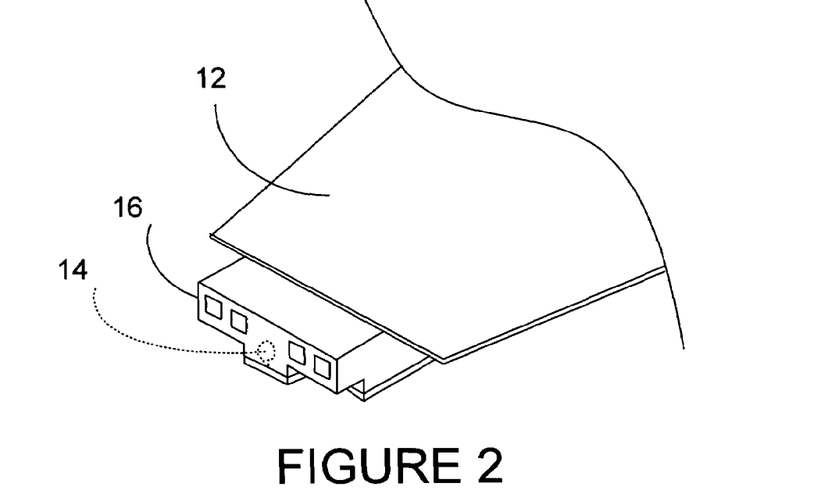
FIG. 2 illustrates a perspective view of view of an exemplary slider and suspension.
Figure 3:
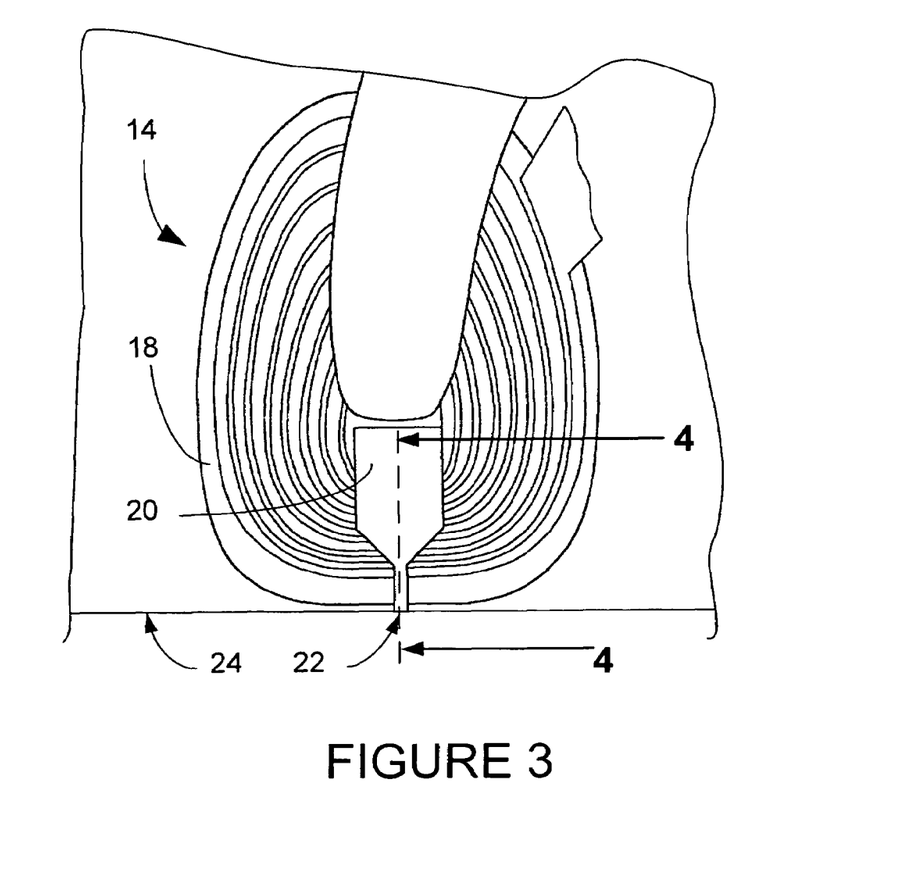
FIG. 3 shows a top plan view of an exemplary read/write head.

FIG. 2 shows a slider 16 in more detail being supported by suspension 12. The magnetic head 14 is shown in dashed lines, and in more detail in FIGS. 3 and 4. The magnetic head 14 includes a coil 18 and P1 pole, which also acts as S2 shield, thus making P1/S2 20. P1 S2 may also be made as two discrete layers. The second pole P2 22 is separated from P1/S2 by write gap 23. The ABS 24 is shown for reference.

There are two configurations of read heads in common use in the industry today. These are called Current Perpendicular to the Plane (CPP), and Current In the Plane (CIP). In the CIP configuration, current flows from side to side; that is from a lead through the read sensor to another lead. A cross section view of a CIP slider is shown in FIG. 4, which generally includes a write head portion 26 and a read head portion 28. For CIP read heads, the read sensor 40 is generally sandwiched between two insulation layers, usually designated gap1 34 and gap2 36 which are made of non-conductive material, to keep the circuit from shorting out. These are further sandwiched by magnetic shield layers S1 30 and S2 20. For the purposes of this discussion, the read head 28 will be considered to be in CIP configuration.

A typical CIP read sensor 40, and lead layer stacks 55, including lead layers 56, hard bias layers 58 and seed layers 60, are shown in FIG. 5. The sensor 40 is generally made up of a number of layers, to make a sensor stack 42, which generally includes an Anti-ferromagnetic (AFM) layer 44, a pinned magnetic layer 46, a spacer layer 48, a free magnetic layer 50 and a cap layer 52. The sensor stack 42 is built on the gap 1 insulating layer 34, as discussed above.

The lead layer stacks 54 are typically made up of lead layers 56 built on hard bias layers 58, built in turn on a seed layer 60. The hard bias layers 58 are generally aligned with the free layer 50 of the sensor stack 42, and act to give a bias direction to the magnetic domains in the free layer 50.

This configuration of sensor is referred to as a Giant Magneto-Resistive (GMR) read sensor, and typically the sensor stack 42 is formed before the lead layer stacks 54 are formed around them. The present invention may be best understood by a comparison with the general methodology used in the prior art for forming the read head and leads, as shown in FIGS. 6-8 (Prior art) and discussed above.

This manufacturing process of the prior art involves ion milling of the sensor stack 42. This milling step also typically partially mills the underlying gap1 layer 34. The process is preceded by increasingly complex photolithography and liftoff operations in order to accommodate shrinking dimensions.

A potential disadvantage to the prior art process is the effect of ion milling on the GMR sensor 40 and gap1 34, and the growing demands on the associated lithography and liftoff process. Bombardment of energetic ions on a GMR sensor during milling may create damage such that its magnetic performance is undermined. This damage starts at the edges of a read track and propagates inwards. Thus the consequence will become more severe as the physical width of the read-head is reduced.

It is also known that uncontrolled milling of a gap layer can create catastrophic Electrostatic Discharge (ESD) problems. Again this may be attributable to physical damage to the gap material by ion bombardment.

Finally, the milling process requires a masking material that has sufficient selectivity in order to retain adequate thickness for subsequent liftoff. With shrinking size, the required stack thickness may not be sustainable. Thus alternative methods involving multiple resist layers may be required.

In contrast to these disadvantages, the method of the present invention is shown in FIGS. 9-17. The present invention overcomes the above disadvantages by eliminating the ion-milling step used for delineating GMR sensors. This is achieved by reversing the current order of manufacturing processes. Specifically, the hard bias layer and other lateral layers are patterned before deposition of the GMR sensor. These lateral layers thus act as a template for deposition of the GMR sensor, so that the read-head is defined as deposited, rather than milled. The critical width of the read head is thus defined by the spacing between the lateral layers. The thinness of the hard bias layer allows utilization of either a thin single imaging resist layer or a thin bi-layer resist system (i.e. simplification of K5 lithography). This in turn allows higher resolution patterning, and facilitation of a standard liftoff process.

Figure 9:
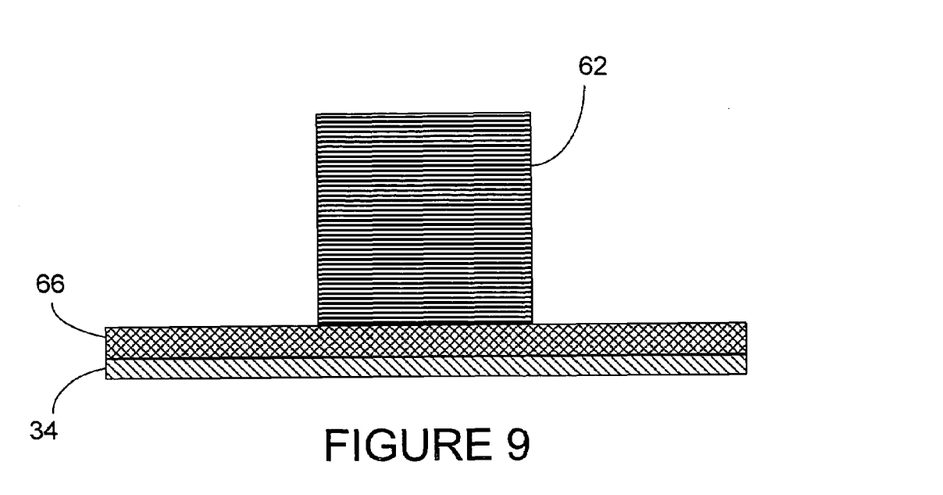
FIGS. 9-14 are front plan views of stages in the construction of a first embodiment of a CIP read sensor of the present invention as seen from the ABS.

FIG. 9 shows the gap1 layer 34, upon which a spacer layer 66, preferably of dielectric, such as $SiO_2$ has been formed. A photomask layer 62 has been formed on the spacer layer 66. The dielectric layer 66 has been formed with a pre-defined thickness so that there will be alignment of portions of the hard bias layer with portions of the free layer, to be discussed below. The spacer layer 66 could alternately be made of certain metals, such as Ta. It is preferable that the dielectric or metal be removable by Reactive-Ion-Etching (RIE), and the RIE should have good selectivity to the gap1 layer material so that the gap layer 34 can act as a precise etch stop.

Figure 10:
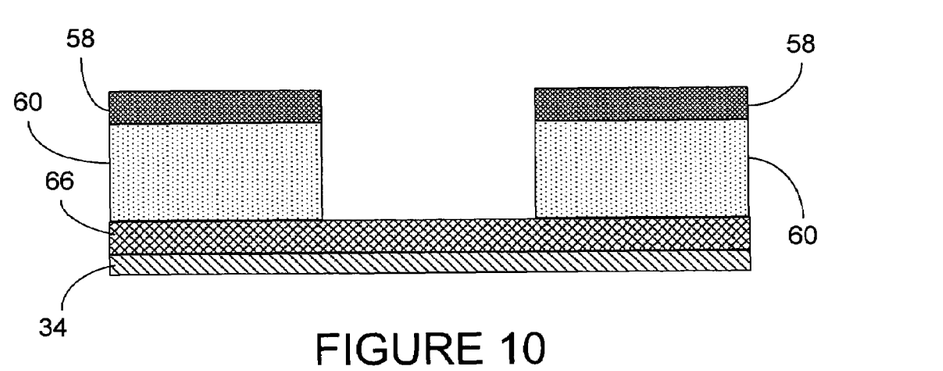

FIG. 10 shows that seed layers 60 and hard bias layers 58 have been formed, and the photomask layer 62 has been removed. This is achieved through deposition of the seed layer material and the hard bias layer over the photomask layer 62, followed by liftoff.

Figure 11:
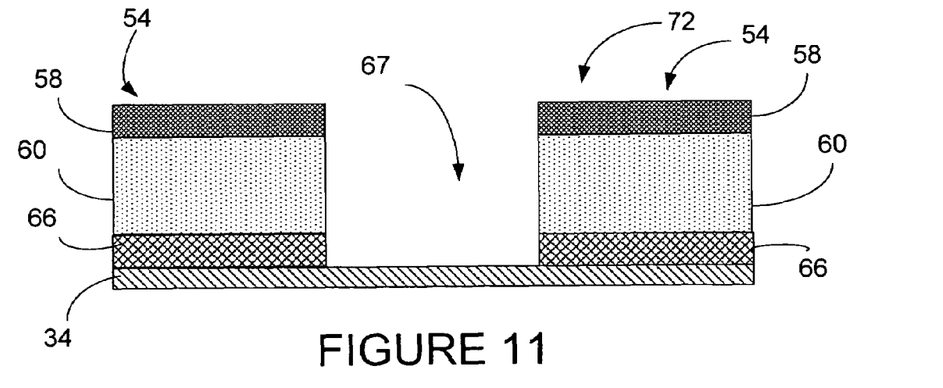

FIG. 11 shows that Reactive Ion Etching (RIE) has been used to etch the spacer layer 66. The gap1 layer 34 acts as an etch stop. The stacks of material on either side surround a groove 67. The spacer layers 66, seed layers 60, and hard bias layers 58 together will be termed the lateral stacks 54, and will define the lateral dimension of the sensor stack to be formed below. In other words, the lateral stacks 54 make up a template 72, so that the read head is defined as deposited, rather than as milled. As discussed above, this has many advantages in terms of quality of the finished read head. These problems are avoided by the present invention.

Figure 12:
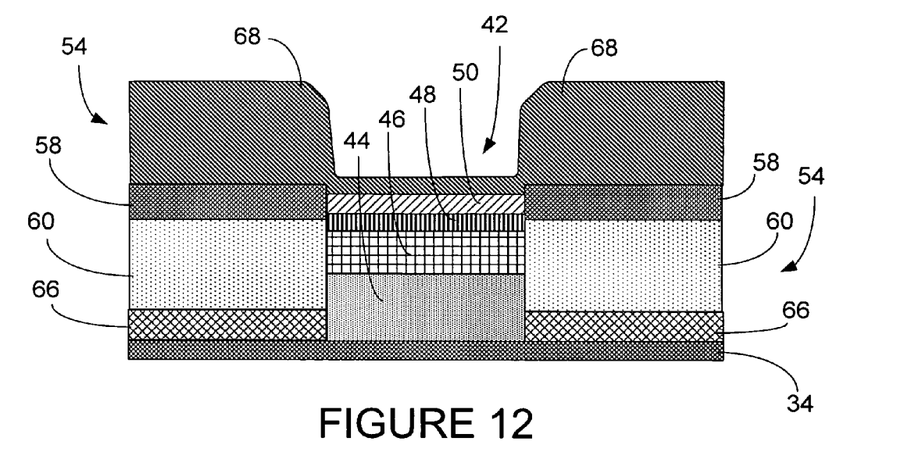

FIG. 12 shows the deposition of the sensor stack 42, including the AFM layer 44, pinned layer 46, spacer layer 48 and free layer 50, a portion of which, as mentioned before, is aligned with a portion of the hard bias layer 58. The deposition process leaves extraneous sensor stack material, which is eventually removed or reshaped. This extraneous sensor stack material is designated as residual material 68. The residual material 68 coats both lateral stacks 54.

Figure 13:
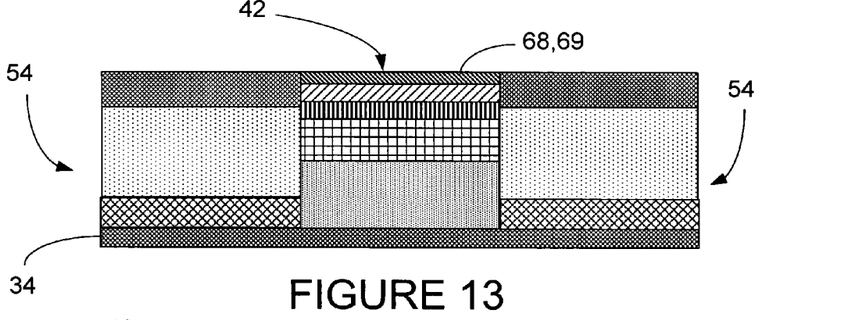
Figure 14:
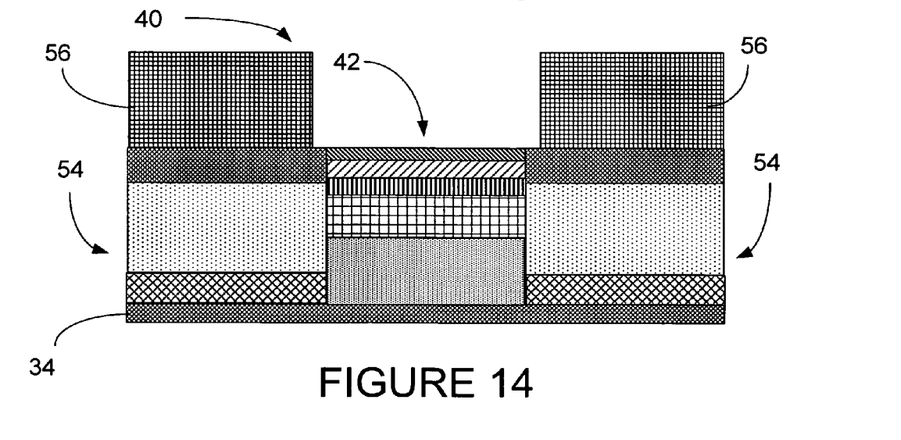

There are two alternatives as to the next stage of the fabrication. The first is shown in FIGS. 13-14, the second shown in FIGS. 15-17. In the first of these alternatives, Chemical Mechanical Polishing (CMP) is performed to remove excess material, and planarize the lateral stacks 54 and sensor stack 42 as shown in FIG. 13. The residual material serves as a type of cap layer 69 in FIG. 13. The lead layers 56 are then formed to complete the CIP read sensor 40, as shown in FIG. 14.

Figure 15:
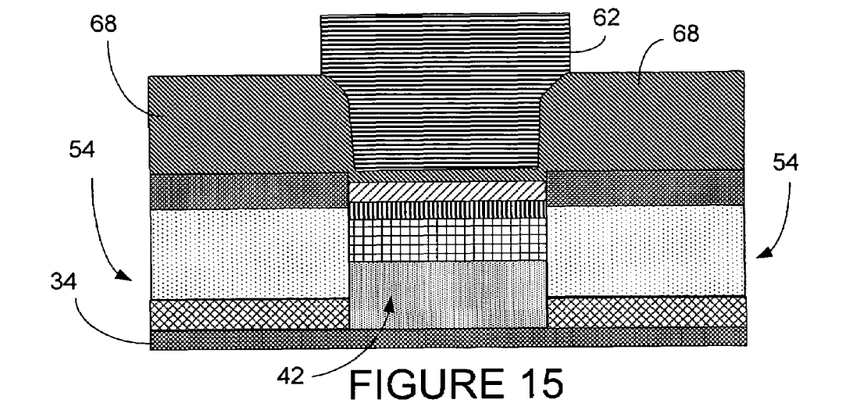
FIGS. 15-17 are front plan views of stages in the construction of an alternate embodiment of a CIP read sensor of the present invention as seen from the ABS.

The second alternative takes up after the stage shown in FIG. 12, which produces the configuration shown in FIG. 15. A new layer of photomask material 62 is deposited on the top of the sensor stack 42 and portions of the residual material 68 which covers the lateral stacks 54.

Figure 16:
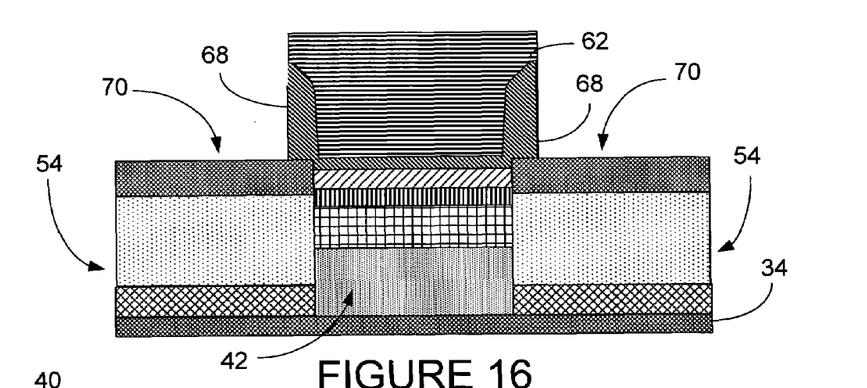

Ion milling is then used to cut away the exposed residual material 68 from the tops of the lateral stacks 54, as shown in FIG. 16, to form lead layer sites 70. The photomask 62 protects underlying material.

Figure 17:
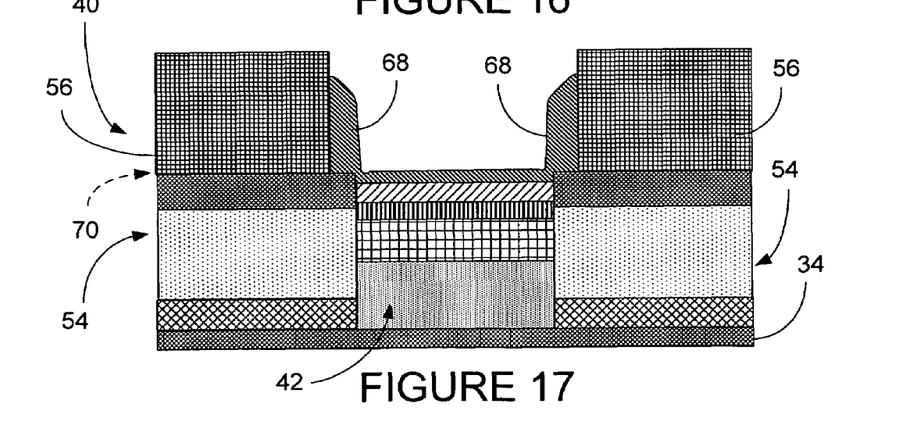

The lead layer 56 is then deposited on the lead layer sites 70 and then lifted off to complete the CIP read sensor 40, as shown in FIG. 17.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

READ SENSORS DEFINED BY LATERAL STACK TEMPLATES
AND METHOD FOR FABRICATION
INVENTOR: LEE, Kim, et. al.
Atty. ref.: HSJ9-2004-0368US1 (60717-346201)
THIS CORRESPONDENCE CHART IS FOR EASE OF
UNDERSTANDING AND INFORMATIONAL PURPOSES ONLY,
AND DOES NOT FORM A PART OF THE FORMAL PATENT
APPLICATION.

| | |
|---|---|
| 2 | magnetic disk drive |
| 4 | magnetic data storage disks |
| 6 | data tracks |
| 8 | data read/write device |
| 10 | actuator arm |
| 12 | suspension |
| 14 | magnetic heads |

READ SENSORS DEFINED BY LATERAL STACK TEMPLATES
AND METHOD FOR FABRICATION
INVENTOR: LEE, Kim, et. al.
Atty. ref.: HSJ9-2004-0368US1 (60717-346201)
THIS CORRESPONDENCE CHART IS FOR EASE OF
UNDERSTANDING AND INFORMATIONAL PURPOSES ONLY,
AND DOES NOT FORM A PART OF THE FORMAL PATENT
APPLICATION.

| | |
|---|---|
| 16 | sliders |
| 18 | coil |
| 20 | P1/S2 |
| 22 | second pole P2 |
| 23 | write gap |
| 24 | ABS |
| 26 | write head portion |
| 28 | read head portion |
| 30 | Shield S1 |
| 32 | insulation |
| 34 | gap1 insulation layer |
| 36 | gap2 insulation layer |
| 40 | CIP read sensor |
| 42 | sensor stack |
| 44 | AFM layer |
| 46 | pinned layer |
| 48 | spacer |
| 50 | free layer |
| 52 | cap layer |
| 54 | lateral stacks |
| 56 | lead layers |
| 58 | hard bias layers |
| 60 | seed layer |
| 62 | photomask |
| 64 | ion milling beam |
| 66 | spacer layer |
| 68 | residual material |
| 69 | cap layer |
| 70 | lead sites |
| 72 | template |

What is claimed is:

1. A method for fabricating a magnetic head having a sensor stack and two lateral stacks, said sensor stack and said lateral stacks being formed on a gap layer, said method comprising:

A) forming said lateral stacks on said gap layer, surrounding a groove;

B) forming said sensor stack by depositing sensor stack material in said groove;

C) forming a residual material on said lateral stacks and said sensor stack material; and D) forming lead layers on said lateral stacks by
 i) depositing a photomask on said sensor stack material which has been deposited on said sensor stack and a portion of said residual materials on said lateral stacks to form protected portions and exposed portions on said residual material;
 ii) shaping said exposed portions of said residual material on said lateral stacks to form sites for lead layers; and
 iii) forming the lead layers on said lead layer sites.

2. The method of claim 1, wherein:
each of said lateral stacks includes a hard bias layer, and said sensor stack includes a free layer, wherein a portion of said hard bias layer is aligned with a portion of said free layer.

3. The method of claim 2, wherein;
each of said lateral stacks further includes a spacer layer, disposed between said gap layer and said hard bias layer.

4. The method of claim 3, wherein:
said spacer layer is a dielectric layer.

5. The method of claim 3, wherein:
said spacer layer is a metal layer.

6. The method of claim 2, wherein:
each of said lateral stacks further includes a seed layer.

7. The method of claim 2, wherein:
said sensor stack further includes an AFM layer and a pinned layer.

8. The method of claim 1, wherein A comprises:
i) forming a spacer layer on said gap layer;
ii) forming a photomask on said spacer layer;
iii) forming said lateral stacks on either side of said photomask layer;
iv) removing said photomask layer; and
v) etching said spacer layer to form said groove.

9. A method for fabricating the read head of a magnetic head comprising:
A) forming a template from lateral stacks, surrounding a groove;
B) forming a sensor stack in said groove of said template by depositing sensor stack material;
C) forming a residual material on said lateral stacks and said sensor stack material and said sensor stack material; and
D) forming lead layers on said lateral stacks by
i) depositing a photomask on said sensor stack material which has been deposited on said sensor stack and a portion of said residual material on said lateral stacks to form protected portions and exposed portions on said residual material;
ii) shaping said exposed portions of said residual material on said lateral stacks to form sites for lead layers; and
iii) forming the lead layers on said lead layer sites.

10. The method of claim 9, wherein A comprises:
i) forming a photomask;
ii) forming lateral stacks on either side of said photomask; and
iii) removing said photomask to form a groove between said lateral stacks.

11. The method of claim 10, wherein i) of A comprises:
a) forming a gap layer;
b) forming a spacer layer on said gap layer;
c) forming said photomask on said spacer layer.

12. The method of claim 11, wherein iii) of A comprises:
a) removing said photomask layer to form the groove; and
b) etching said spacer layer to extend said groove.

13. The method of claim 12, wherein:
said gap layer is composed of material that acts as a stop layer for said etching of said spacer layer.

* * * * *

UNITED STATES PATENT AND TRADEMARK OFFICE
CERTIFICATE OF CORRECTION

PATENT NO. : 7,472,469 B2
APPLICATION NO. : 11/231438
DATED : January 6, 2009
INVENTOR(S) : Heim et al.

It is certified that error appears in the above-identified patent and that said Letters Patent is hereby corrected as shown below:

In line 8 of Claim 9, repetition of "said sensor stack material" is to be removed so that col. 7 lines 21-23 correctly recite:

"C) forming a residual material on said lateral stacks and said sensor stack material; and".

Also, in col. 5, line 53 - col. 6, line 35, the Correspondence Chart, which is clearly labeled as not forming a part of the formal patent application, is to be removed.

Signed and Sealed this

Twenty-fourth Day of February, 2009

JOHN DOLL
*Acting Director of the United States Patent and Trademark Office*